United States Patent
Cunningham

(10) Patent No.: US 6,525,273 B1
(45) Date of Patent: Feb. 25, 2003

(54) CABLE MANAGEMENT

(75) Inventor: William Cunningham, Westborough, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/966,322

(22) Filed: Sep. 28, 2001

(51) Int. Cl.⁷ .............................. H01B 7/40; F16L 3/00
(52) U.S. Cl. .................... 174/135; 24/17 A; 24/30.5 R; 248/68.1; 248/74.3
(58) Field of Search ..................... 174/70 A, 72 A, 174/135; 24/16 PB, 16 R, 17 A, 30.5 R, 300; 248/68.1, 74.2, 74.3

(56) References Cited

U.S. PATENT DOCUMENTS

| | | | | |
|---|---|---|---|---|
| 3,599,915 A | * | 8/1971 | Soltysik | 248/68.1 |
| 3,654,668 A | * | 4/1972 | Appleton | 24/130 |
| 4,680,834 A | * | 7/1987 | Andre et al. | 24/16 PB |
| 4,708,306 A | * | 11/1987 | Mitomi | 24/16 PB |
| 4,735,387 A | * | 4/1988 | Hirano et al. | 24/16 PB |
| 4,766,651 A | * | 8/1988 | Kobayashi et al. | 24/16 PB |
| 4,893,381 A | * | 1/1990 | Frankel | 24/16 R |
| 5,048,158 A | * | 9/1991 | Koerner | 24/16 PB |
| 5,062,184 A | * | 11/1991 | Rowland | 24/16 PB |
| 5,901,756 A | * | 5/1999 | Goodrich | 248/68.1 |
| 6,209,827 B1 | * | 4/2001 | Kawai | 248/74.3 |
| 6,254,042 B1 | * | 7/2001 | Kogure et al. | 248/74.1 |
| 6,393,670 B1 | * | 5/2002 | Bealmear | 24/16 PB |

* cited by examiner

Primary Examiner—Anthony Dinkins
Assistant Examiner—Adolfo Nino
(74) Attorney, Agent, or Firm—Bromberg & Sunstein LLP

(57) ABSTRACT

A cable management system for securely holding one or more cables in position. The system includes a base, a lock, and an elastic member. The elastic member holds one or more cables against the base when the lock is engaged. The lock may be any one of a number of different types of locking structures including a tab, velcro, or a screw for example. The cable management system may further include a mounting mechanism for mounting the cable management system to a chassis containing components to which the one or more cables are connected. The mounting mechanism may allow the cable management to be cantilevered away from the chassis. In another embodiment, the mounting mechanism may simply be a screw mount such that the back of the base lies flush with a surface on which the cable management system is being mounted. The cable management system may include a groove in the base for providing two or more points of friction preventing the one or more cables from slipping across the base when the lock is engaged. The base may further include one or more prongs, which are positioned on opposite sides of the groove and assist in both aligning the elastic member and preventing the lock from becoming disengaged, when force is placed on the cables.

25 Claims, 5 Drawing Sheets

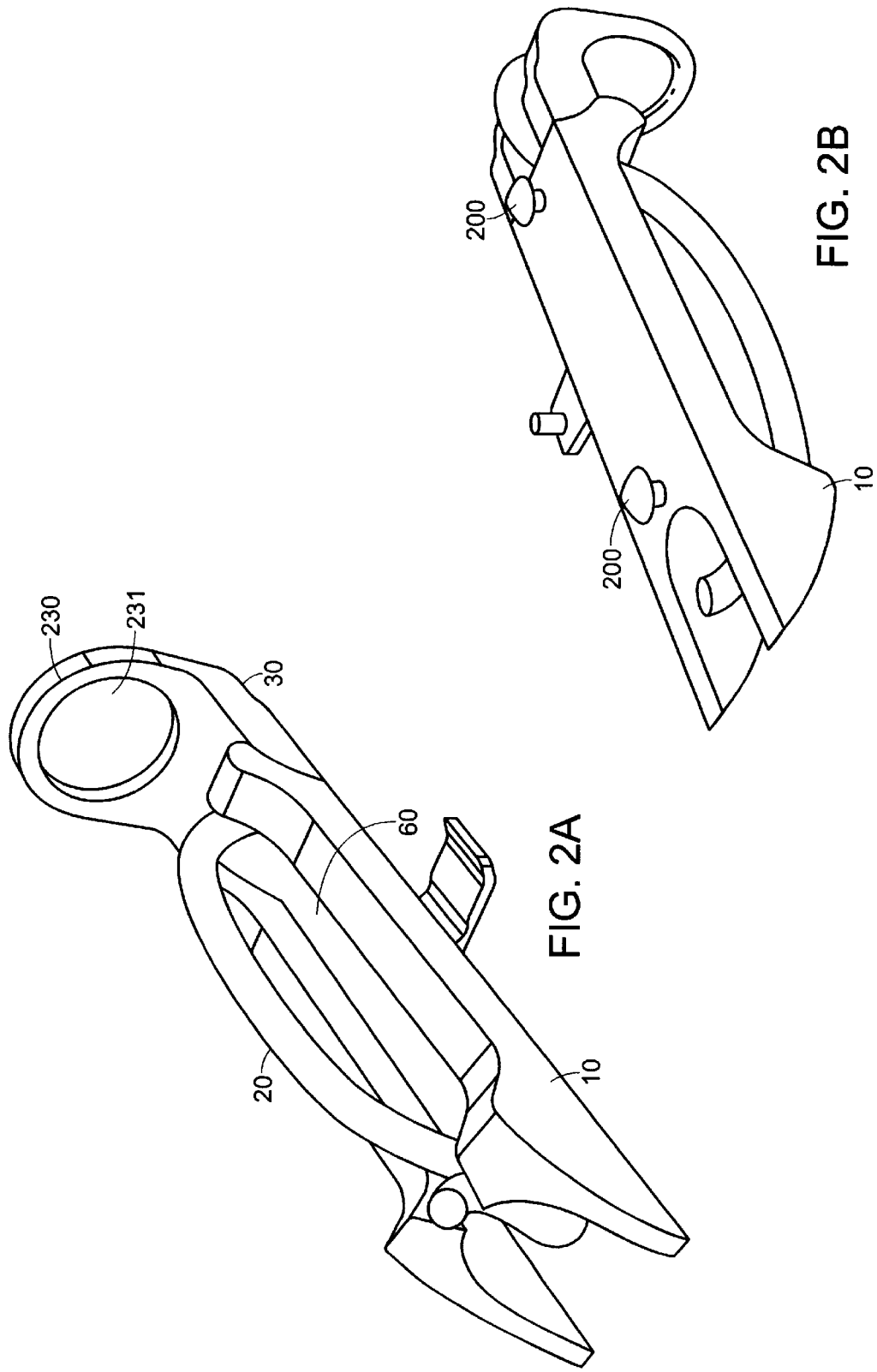

CABLE MANAGEMENT

TECHNICAL FIELD AND BACKGROUND ART

The present invention relates to cable management devices and more particularly cable management devices for use with electronic components.

Computer systems and other rack-mounted electronics receive input and send output through a channel to communicate information with other electronic components. In general, the channel has taken the form of one or more cables. Each cable includes a connector at both ends, which meshes to input and output (I/O) receptors on an electronic component. When such electronic components are mounted in a rack having multiple shelves, the cables of one electronic component often fall in such a way as to block access to the cable I/O receptors of other electronic components, as well as, other components without I/O receptors which reside on lower shelves. In order to alleviate this problem, prior art cable management systems were developed. These systems often connected to the rack or the back of such components and allowed the connected cables to be grouped together and moved to one side of the rack, thus permitting dear access to the I/O receptors of the other electronic components.

One such design provides one or more hooks onto which the cables are placed creating a cable chase. Unfortunately, when a component is being serviced, added or removed, the cables may shift, be pulled or stepped on and become dislodged from the hook recreating the problem that the hook was attempting to solve. To alleviate this problem, second generation cable management systems employed hook and loop closures. Hook and loop closures provide the advantage of securing the cables in one location even when other I/O receptors or components are being serviced. Additionally, the hook and loop closures add the desirable feature of allowing additional cables to be added or removed at a later time including cables that are already connected at both ends. The hook and loop closures have two major limitations. The first limitation occurs as the result of the wide range of cable sizes and/or quantities of cables that are used with electronic components. The hook and loop closures cannot secure or provide strain relief for an entire range of cables. Although the hook and loop closures secures and strain relieves larger bundles of cables, stress placed along the cable when the cable is pulled will be directly translated to stress and strain at both the cable connectors and the electronic component's I/O receptors when less than the number of cables for which the loop hook and loop closures is designed are used. If stress is applied to the I/O receptors, the stress can cause the component to loose data or create errors in the data. The second limitation is that the hook and loop closures are difficult to secure, sometimes requiring more than one operator. Hook and loop closures require the cables to be held in place while the hook and loop closures are threaded and tightened.

As a result of these limitations, there is a need for a cable management system that provides strain relief over a wide variety of sizes and combinations of cables and is easier for a single person to implement.

SUMMARY OF THE INVENTION

In a first embodiment of the invention there is provided a cable management system for securely holding one or more cables. The system includes a base, a lock, and an elastic member. The elastic member holds one or more cables against the base when the lock is engaged. The lock may be any one of a number of different types of locking structures including a tab, hook and loop closures, or a screw for example. The cable management system may further include a mounting mechanism for mounting the cable management system to a chassis containing components to which the one or more cables are connected. The mounting mechanism may allow the cable management to be cantilevered away from the chassis. In another embodiment, the mounting mechanism may simply be a screw mount such that the back of the base lies flush with a surface on which the cable management system is being mounted.

In yet a further embodiment, the cable management system may include a groove in the base causing the cable to be deflected into the groove which provides two or more points of friction and which prevents the one or more cables from slipping across the base when the lock is engaged.

The base may further include one or more prongs which are positioned on opposite sides of the groove and assist in both aligning the elastic member and preventing the lock from becoming disengaged when a force is placed on one or more of the cables.

In another embodiment, the side of the base that receives the one or more cables may be curved. A curvature on the surface of the base assists in distributing the cables as additional cables are added.

In yet another embodiment, the lock is a rigid member which has a shape that is received into a receptacle that is formed by the base. The lock may include a handle, which enables the stretching of the elastic member for engaging and disengaging the lock. The handle may be T-shaped or may include an orifice that is sized to receive a finger.

The cable management system, in another embodiment, may be configured to receive cables on both the top and bottom surface of the base. In such an embodiment, there are two locks and two elastic members. The locks may be engaged by stretching the elastic member so that the lock fits into a notch in the base.

BRIEF DESCRIPTION OF THE DRAWINGS

The foregoing features of the invention will be more readily understood by reference to the following detailed description, taken with reference to the accompanying drawings, in which:

FIG. 2A is a perspective drawing which shows a top view of the base.

FIG. 2B is a perspective drawing which shows a bottom view of the base;

DETAILED DESCRIPTION OF SPECIFIC EMBODIMENTS

Definitions. As used in this description and the accompanying claims, the following terms shall have the meanings indicated, unless the context otherwise requires. A chassis, as used herein, is defined as any structure for holding one or more electronic components. The term chassis shall include, but is not limited to, computer processor racks, computer towers and computer enclosures.

Figure 1A:
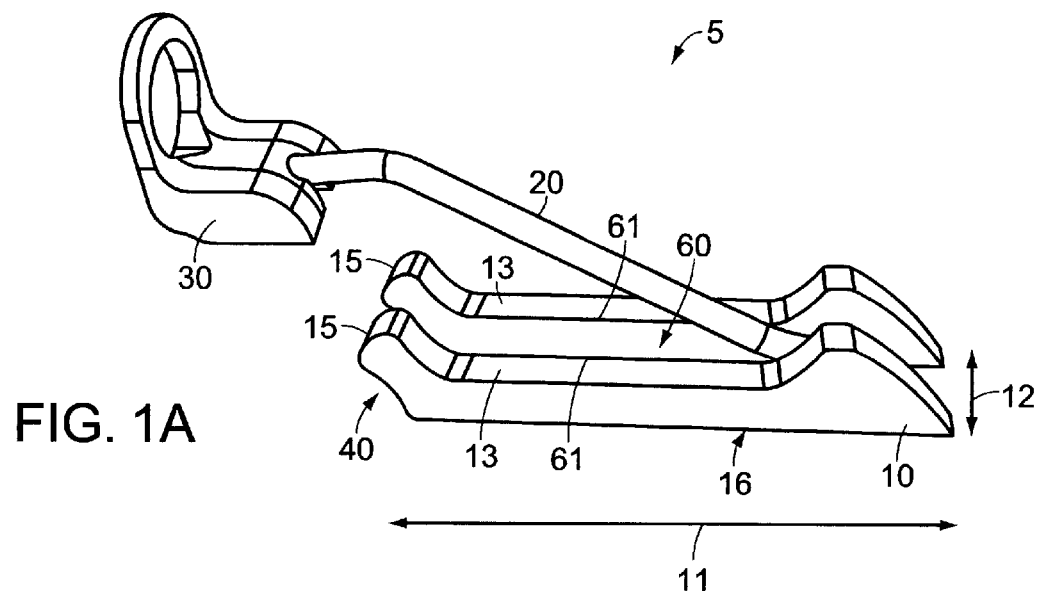
FIGS. 1A–1C are technical drawings showing one embodiment of the cable management system.
Figure 1B:
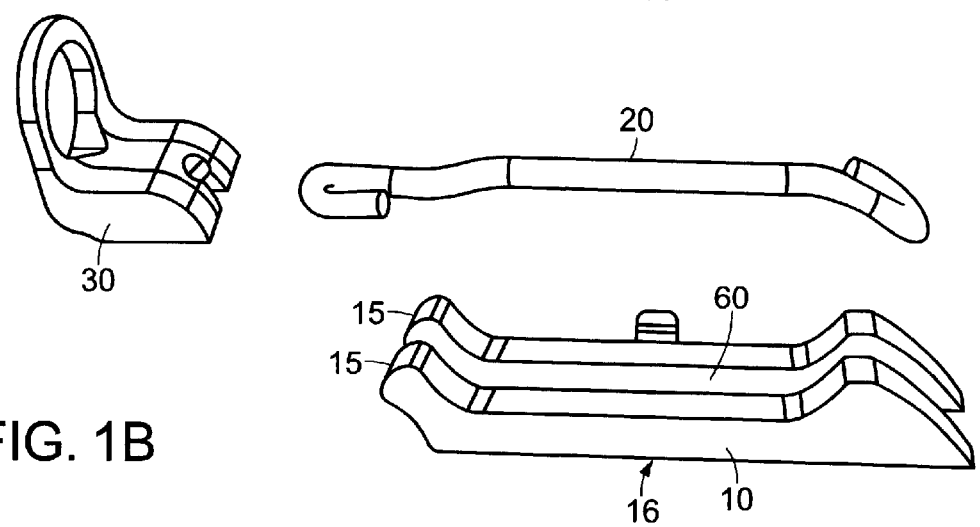
Figure 1C:
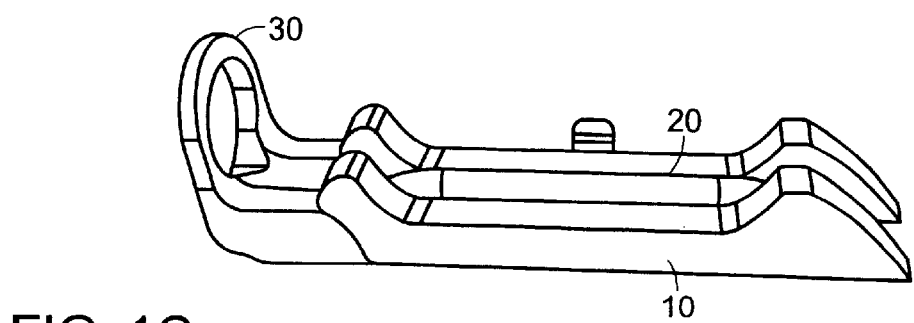

FIGS. 1A–1C are technical drawings showing one embodiment of the cable management system. In the following disclosure, embodiments of the cable management system will be referenced to and shown implemented with computer related electronic components, but other electronic components such as audio equipment or telecommunications equipment which utilize one or more cables may benefit from this invention. The cable management system 5 includes a base 10, an elastic member 20, and a locking mechanism 30. Each element is shown independently in FIG. 1B. FIG. 1A shows the lock 30 in a disengaged position while FIG. 1C shows the lock 30 in an engaged position.

The base 10 is a rigid member having an elongated body with a corresponding length 11 and width 12. The body 10 is designed to receive cables across its width on a top surface 13 wherein the elastic member 20 is placed over the cables and the lock 30 is locked by stretching the elastic member 20 until the lock 30 is properly positioned and received by its receptacle 40. In this embodiment the receptacle 40 is part of the body. The body 10 may be formed from any number of materials including but not limited to metals, plastics, alloys and composites. The body 10 includes one or more pairs 15 of prongs which are located on each side of a groove 60 which is formed in the body 10 along the length 11 of the body 10. In this embodiment, the prongs 15 are located at a first end of the base 10 and provide the function of aligning the elastic member with the groove 60 when the lock 30 is engaged.

The groove 60 may, but need not extend along the entire top surface 13 of the base. The groove 60 provides two benefits. It assists in the process of self-alignment of the elastic member 20 and provides at least two points of friction so that the cables are less apt to slide across the top surface when a force is applied to the cable.

The groove 60 is constructed to receive the elastic member and has a complementary shape to the elastic member. The complementary shape assists in alignment of the elastic member, since the elastic member naturally resides in the groove. In this context, alignment refers to the elastic member being in the position for proper engagement of the lock. In FIG. 1A the elastic member is round and the groove is concave. The groove need not be the identical shape of the elastic member in order to provide alignment and the elastic member need not be round. The groove 60 need only be concave so that the elastic member 20 is aligned and gravitates to the center of the groove 60.

As the elastic member 20 is stretched over the one or more cables (not shown), the elastic member 20 exerts pressure onto each cable forcing the cable to conform with the shape of the top surface of the base. This force causes a portion of the cable's sleeve (the outer insulation) to be deflected into the groove 60. The force exerted by the elastic member 20 is such that the cable is not crimped but is only deflected. This deflection along with the edges 61 of the groove 60 creates two or more points of friction when a force is placed along the cable. The points of friction between the deflected cable and the edges 61 of the groove 60 assist in providing stress relief. By providing the groove, and thus providing stress relief for the cable, the forces that are placed on the cable are either not translated or are lessened at the cable connector and I/O receptors of the electronic component.

In the present embodiment, the lock 30 is a rigid structure which is shaped so as to be received by a cutout receptacle 40 formed in the base 10. In the design of FIG. 1A, the prongs 15 form part of the receptacle. The shape of the cut out is semi-circular while the lock 30 has a complementary curved shape so that the two parts mate. The locking mechanism 30 may take the form of any structure which may be used to detachably couple two components together. For example, the locking mechanism 30 may be implemented with, but is not limited to hook and loop closures, snaps, one or more screws, and hook-and-tab closures.

In the embodiment of FIGS. 1A–C, the top surface 13 of the base 10 is configured to receive the one or more cables while the bottom surface 16 of the base is planar to allow for mounting to another planar surface such as the side of a chassis. The base 10 includes a mount such as a slot receive a screw for coupling the base to the chassis. Other means for mounting may also be used, such as but not limited to adhesives, slots and tabs, and bolts. FIG. 2 shows both a top view and a bottom view of the base 10. The top view shows the elastic member 20 in a stretched position so as to make the groove 60 in the base visible. When the elastic member 20 is not stretched, the elastic member 20 lies in the groove as shown in FIG. 1C. The bottom side of the base of FIG. 2 includes tabs 200, which fit into keyhole receptacles that are part of the chassis (not shown). In other embodiments, the base may include a cantilever section such that the cantilever section allows the base to extend away from the chassis or electronic component.

Figure 2C:
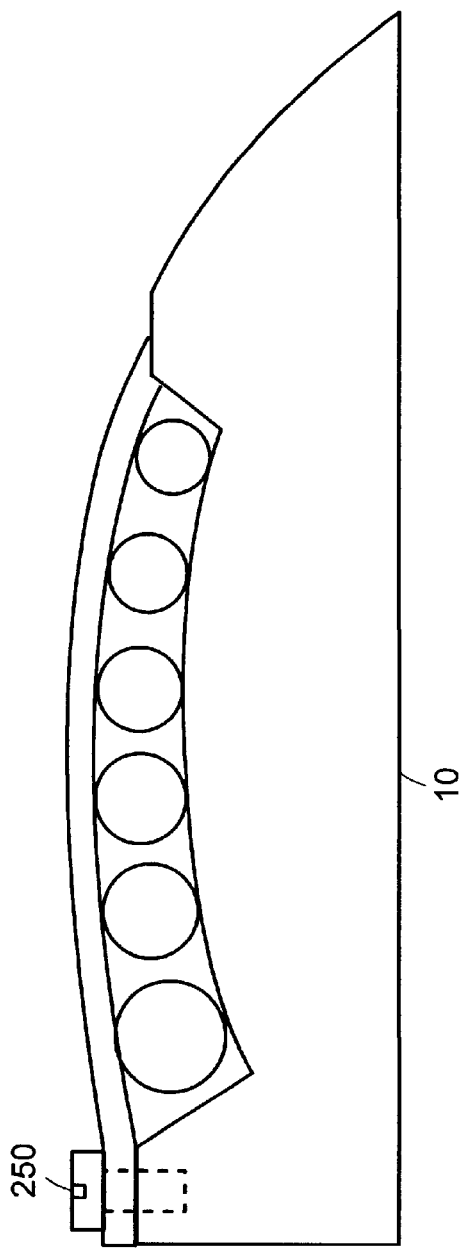
FIG. 2C is a side view of a cable management system employing a screw as a locking mechanism.
Figure 2D:
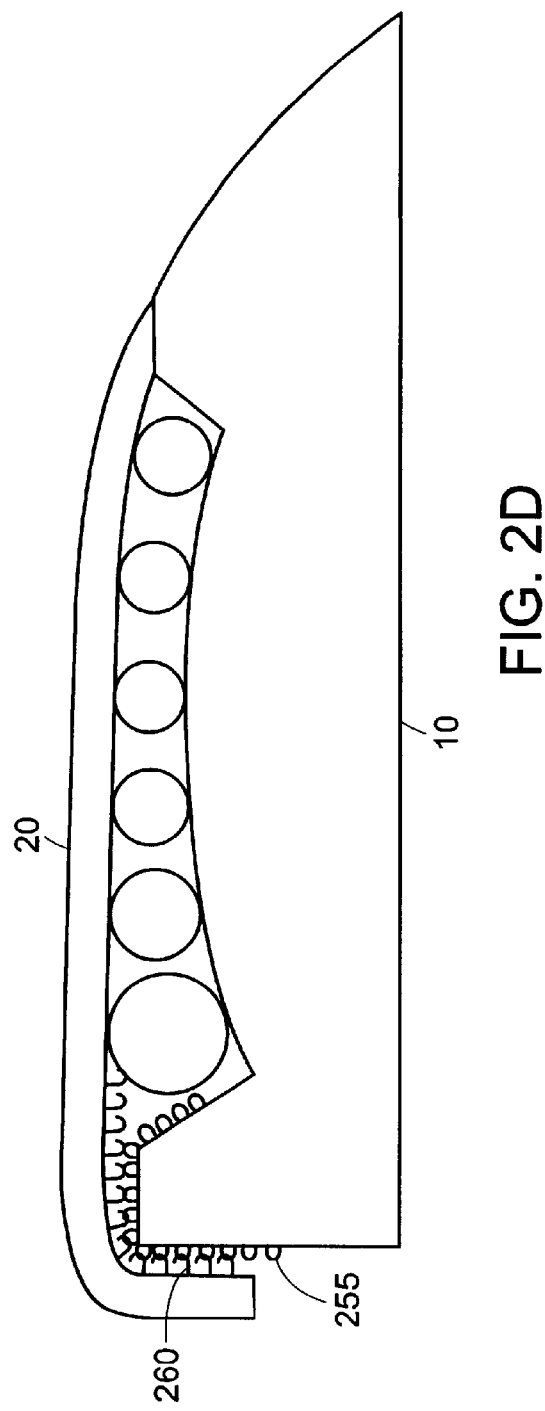
FIG. 2D is a side view of a cable management system employing hook and loop closures as a locking mechanism.

The lock of FIGS. 2A–B includes a handle 230 and further includes an orifice 231. The handle 230 allows a user to grasp the lock 30 and stretch the elastic member 20 with a single hand. Thus, a single operator can position the cables with one hand while securing the cables with the other hand. The orifice 231 is provided to allow a user to more readily grasp the lock 30 when attempting to engage or disengage the lock 30, especially in a confined area. The orifice 231 is preferably sized to receive a human finger. FIGS. 2C–D show two alternative embodiments for the lock. In FIG. 2C the locking mechanism is a screw 250 that is attached to the elastic member 20 and fits into the base 10. In FIG. 2D the elastic member 20 and the base 10 have hooks 255 and loops 260 attached thereto for locking the elastic member in position.

This embodiment is designed to lie flush against a structure such as a chassis, which holds multiple electronic components such as processors, switches and data storage devices.

Figure 3:
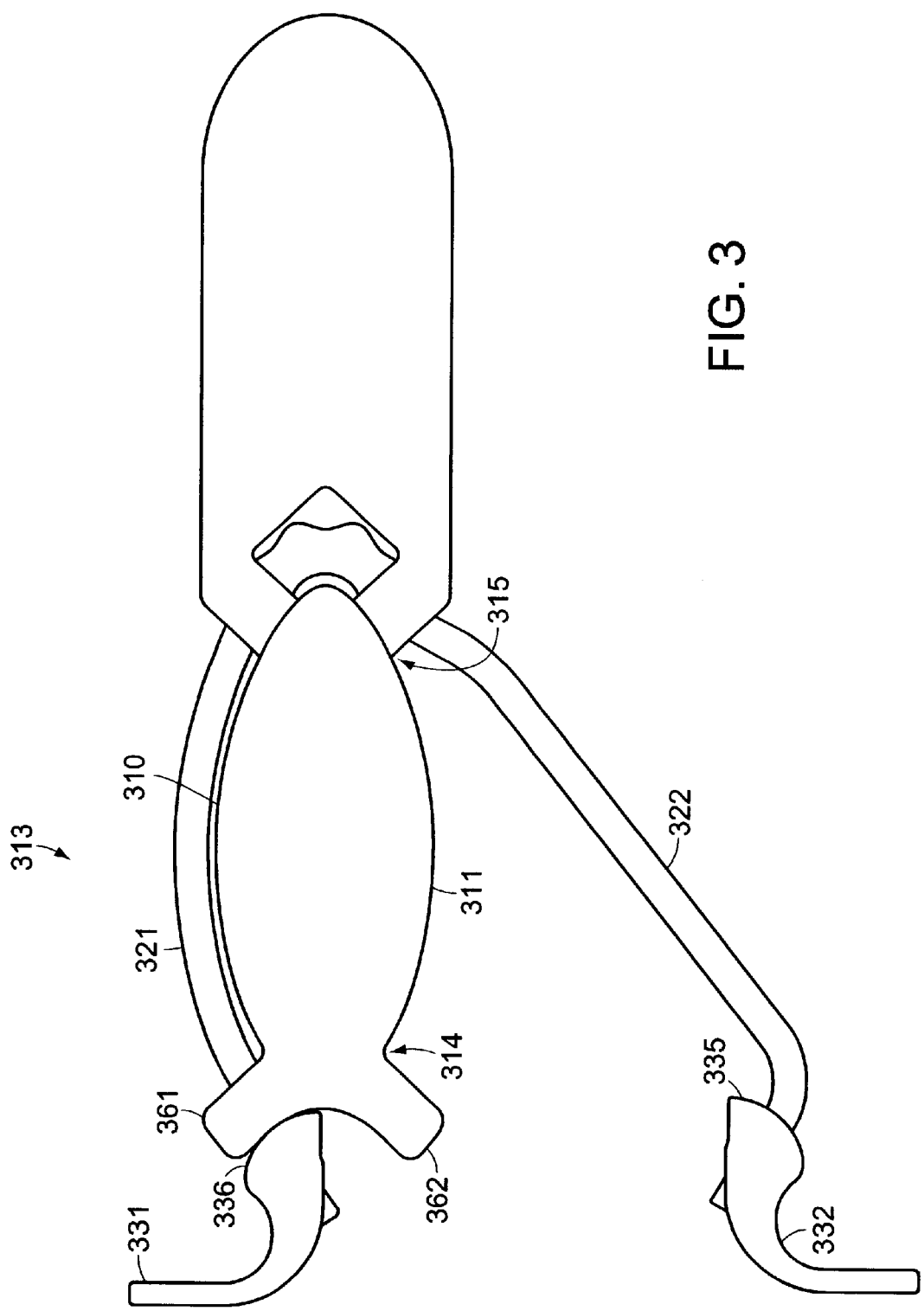
FIG. 3 shows a second embodiment of the cable management system in which both surfaces of the base receive cables.

FIG. 3 shows a second embodiment of the cable management system. In this embodiment, the base 10 has a top and bottom surface 310, 311 in which both surfaces receive cables as opposed to the embodiment of FIGS. 1A–C in which only the top surface received cables. Both surfaces of the base are curved along the length 313 of the base 10. This convex curvature assists in equally distributing the cables across the entire surface. As more cables are added, the cables are forced down the slope of the curvature to either the distal 314 or proximate 315 side of the curved surface. It should be understood that providing a convex curvature is equally applicable to the embodiment of FIGS. 1A–C.

In the present embodiment of FIG. 3, there is a first lock 331 and a first elastic member 321, which reside on the top surface and a second lock 332 and a second elastic member 322 for the bottom surface of the base. In this embodiment, there are two sets of prongs 361, 362, which are at the distal end of the base. The two sets of prongs, in combination, form a semicircular shape while a portion of each of the locks form a quarter circle 335, 336, so that the two locks 331,332 fit into the semicircular shape formed by the prongs 361, 362.

Figure 4:
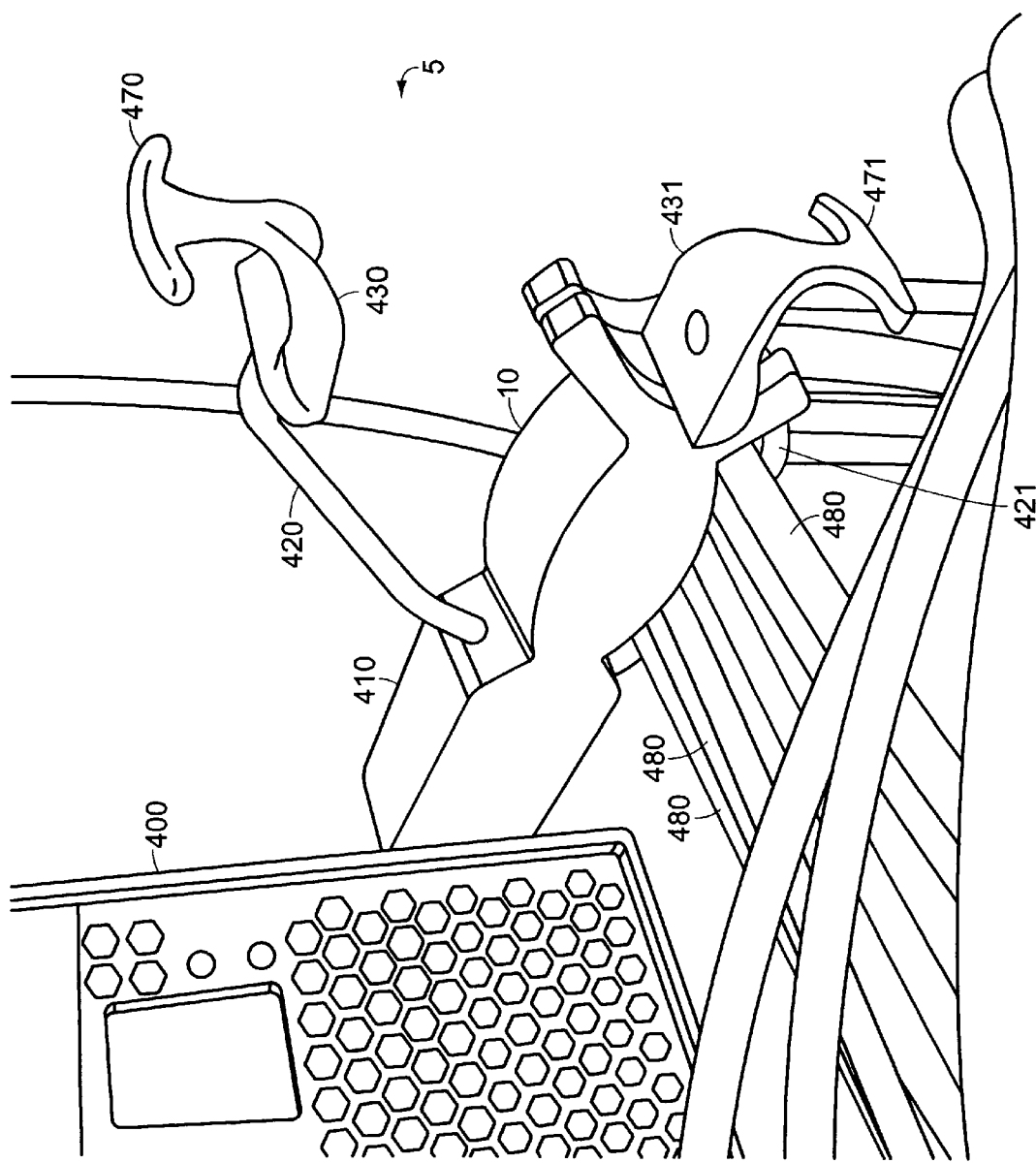
FIG. 4 shows another embodiment of the cable management system attached to a computer by a cantilevered mounting structure.

FIG. 4 shows another embodiment of the cable management system attached to a computer enclosure 400. In this embodiment, the base 10 is integrated with a mounting structure 410 so that the cable management system 5 is cantilevered from the computer enclosure 400. The mounting structure 410 may include any conventional mounting hardware such as screws, nuts and bolts, and slots and tabs but is not limited to such mounting means. The mounting structure 410, which in this embodiment is a rigid member, may be integral to the base or a separate component. In other embodiments, the cable management system, including the base and the mounting structure, may be integrated into a computer chassis, such as a rack.

In the embodiment shown in FIG. 4, each lock 430, 431 includes an integrated T-shaped handle 470, 471 which allows a user to grasp the handle and stretch the elastic member 420, 421. Other shaped handles may be integrated into the lock for facilitating the opening and closing of the lock. As can be seen in FIG. 4, cables 480 of multiple sizes may be used with the cable management system 5. The elastic members 420, 421, having elastic properties, stretch over the cables of various sizes and distribute a centric force to the base 410 on all of the cables 480, thus preventing them from slipping across the width of the base 10.

Although various exemplary embodiments of the invention have been disclosed, it should be apparent to those skilled in the art that various changes and modifications can be made which will achieve some of the advantages of the invention without departing from the true scope of the invention. These and other obvious modifications are intended to be covered by the appended claims.

What is claimed is:

1. A cable management system for securely holding one or more cables, the system comprising:
   a base;
   a lock; and
   an elastic member for holding one or more cables against the base when the lock is engaged, wherein the elastic member is coupled to both the base and the lock;
   wherein the base has a first side and a second side and a groove is formed in the base on the first side and when a cable is placed on the first side of the base and the elastic member is placed over the cable and locked, the cable is secured by the elastic member which deflects the cable into the groove.

2. The cable management system according to claim 1, wherein the lock is a tab.

3. The cable management system according to claim 1, wherein the lock is hook and loop closures.

4. The cable management system according to claim 1, wherein the lock is a screw.

5. A cable management system according to claim 1, wherein the system further includes a mounting mechanism for mounting the cable management system to a chassis containing one or more electronic components to which the one or more cables are connected.

6. The system according to claim 1, wherein the elastic member is formed to fit into the groove.

7. The system according to claim 1, wherein the lock fits into a contour formed on the base.

8. The system according to claim 1, wherein the base has one or more prongs on a first side.

9. The system according to claim 1, wherein first side is curved.

10. The system according to claim 1, wherein the base has at least one pair of prongs and the prongs are formed to receive the elastic member there between such that the prongs assist in keeping the lock locked.

11. The system according to claim 1, wherein the base has a width and a length wherein a first axis is defined substantially parallel to the length and a second axis is defined which is substantially perpendicular to the first axis;
   the base having the groove along the first axis;
   wherein when a cable is placed on the base substantially along the second axis the cable is deflected into the groove by the elastic member when the lock is engaged.

12. The system according to claim 11, wherein the lock fits into a cut out in the base.

13. The system according to claim 11, wherein the base includes at least a pair of prongs which are formed on either side of the groove to keep the lock engaged when a force is applied to the one or more cables substantially along the second axis.

14. The system according to claim 1, wherein the lock is shaped to reside in a cut-out formed in the base and further includes a handle for engaging and disengaging the lock with the base.

15. The system according to claim 14, wherein the handle has a T-shaped segment.

16. The system according to claim 14, wherein the handle includes an orifice.

17. The system according to claim 16, wherein the orifice is sized to receive a finger.

18. A cable management system for securely holding one or more cables, the system comprising:
   a base;
   a lock; and
   an elastic member for holding one or more cables against the base when the lock is engaged, wherein the elastic member is coupled to both the base and the lock;
   wherein the base has a proximate end and a distal end, and a first side and a second side and further comprises a second elastic member and a second lock;
   wherein the elastic member is coupled to the first side and the lock and the second elastic member is coupled to the second side of the base and the second lock.

19. A cable management system according to claim 18, wherein the first and second locks are held in place at the proximate end by a notch in the base.

20. An enclosure for storing at least one component, the enclosure comprising:
   a chassis for receiving one or more components having an attached cable;
   a cable-management base;
   a connector for attaching the cable management base to the chassis;
   an elastic member coupled to the cable management base; and
   a lock coupled to the elastic member;
   wherein the cable management base is configured to receive one or more cables wherein the elastic member holds the one or more cables against the cable management base when the lock is engaged wherein the cable management base has a length and a width and a first axis is defined which is substantially parallel to the length and a second axis substantially perpendicular to the first axis, wherein the cable management base has a groove which is substantially parallel to the first axis wherein the attached cable is placed across the cable management base substantially along the second axis wherein when the lock is engaged the elastic member presses the cable into the groove.

21. The enclosure according to claim 20, wherein the connector is integrated into the chassis.

22. The enclosure according to claim 21, wherein the cable management base is integrated into the connector.

23. The enclosure according to claim 20, wherein a first prong and a second prong reside adjacent to the groove and are coupled to the cable management base preventing the lock from becoming disengaged when a force is applied to the cable substantially along the second axis.

24. The enclosure according to claim 20, wherein the cable management base has a curved surface for receiving the one or more cables.

25. The enclosure according to claim 24, wherein the curve of the cable management base is convex.

* * * * *